(12) United States Patent
Chen et al.

(10) Patent No.: US 12,242,150 B2
(45) Date of Patent: Mar. 4, 2025

(54) ELECTRONIC DEVICE

(71) Applicant: InnoLux Corporation, Miao-Li County (TW)

(72) Inventors: Wei-Chih Chen, Miao-Li County (TW); Chih-Ming Liang, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 18/299,540

(22) Filed: Apr. 12, 2023

(65) Prior Publication Data

US 2023/0251519 A1 Aug. 10, 2023

Related U.S. Application Data

(63) Continuation of application No. 17/532,561, filed on Nov. 22, 2021, now Pat. No. 11,656,492, which is a
(Continued)

(30) Foreign Application Priority Data

Jan. 7, 2019 (CN) .......................... 201910011183.X

(51) Int. Cl.
*G02F 1/1335* (2006.01)
*H10K 59/12* (2023.01)
*H10K 59/38* (2023.01)

(52) U.S. Cl.
CPC .. *G02F 1/133512* (2013.01); *G02F 1/133514* (2013.01); *H10K 59/12* (2023.02); *H10K 59/38* (2023.02)

(58) Field of Classification Search
CPC ........... G02F 1/133514; G02F 1/13351; H01L 27/322
See application file for complete search history.

(56) References Cited

U.S. PATENT DOCUMENTS

| | | | |
|---|---|---|---|
| 8,411,233 B2 | 4/2013 | Takahashi et al. | |
| 2003/0043318 A1* | 3/2003 | Kim | G02F 1/133514 349/106 |

(Continued)

FOREIGN PATENT DOCUMENTS

| | | |
|---|---|---|
| CN | 101169550 A | 4/2008 |
| CN | 102445792 A | 5/2012 |

(Continued)

*Primary Examiner* — Alexander P Gross
(74) *Attorney, Agent, or Firm* — Muncy, Geissler, Olds & Lowe, P.C.

(57) ABSTRACT

An electronic device includes: a first substrate; a second substrate opposite to the first substrate; a black matrix layer disposed between the first and second substrates and including a first pixel region and a first shielding region arranged along a first direction, wherein the first pixel region includes first and sub-pixel openings arranged along a second direction different from the first direction; a scan line disposed between the first and second substrates and extending along the second direction, wherein the first shielding region overlaps the scan line; and first and second pixel color resists respectively disposed corresponding to the first and second sub-pixel openings, wherein in a cross-sectional view, a recess is formed between the first pixel color resist and the second pixel color resist, the recess is disposed in the first pixel region, and the recess comprises a curved side wall.

8 Claims, 13 Drawing Sheets

Related U.S. Application Data continuation of application No. 16/719,519, filed on Dec. 18, 2019, now abandoned.

(56) References Cited

U.S. PATENT DOCUMENTS

| | | |
|---|---|---|
| 2007/0072429 A1 | 3/2007 | Dyer et al. |
| 2009/0167996 A1 | 7/2009 | Takahashi et al. |
| 2010/0020275 A1* | 1/2010 | Mima .................. G02F 1/1339 349/106 |
| 2012/0081641 A1* | 4/2012 | Noh .................... G02F 1/13394 445/24 |
| 2014/0267985 A1* | 9/2014 | Sato ................. G02F 1/133512 349/106 |
| 2015/0092133 A1* | 4/2015 | Kajita ............... G02F 1/136209 349/46 |
| 2015/0109697 A1* | 4/2015 | Nagase .................. G02B 5/201 359/891 |
| 2017/0227812 A1* | 8/2017 | Hao ................. G02F 1/133512 |
| 2019/0302500 A1 | 10/2019 | Mibu et al. |
| 2020/0096685 A1 | 3/2020 | Ma et al. |
| 2020/0218115 A1 | 7/2020 | Chen et al. |
| 2022/0082884 A1 | 3/2022 | Chen et al. |

FOREIGN PATENT DOCUMENTS

| | | |
|---|---|---|
| CN | 105652506 A | 6/2016 |
| CN | 107275288 A | 10/2017 |

\* cited by examiner

ELECTRONIC DEVICE

CROSS REFERENCE TO RELATED APPLICATIONS

This application is a Continuation of co-pending U.S. Patent application for "Electronic device", application Ser. No. 17/532,561 filed on Nov. 22, 2021, which is a Continuation of application Ser. No. 16/719,519 filed on Dec. 18, 2019, for which priority is claimed under 35 U.S.C. § 120; and this application claims priority of Application No. 201910011183.X filed in China on Jan. 7, 2019 under 35 U.S.C. § 119, the entire contents of all of which are hereby incorporated by reference.

BACKGROUND

1. Field

The present disclosure provides an electronic device. More specifically, the present disclosure relates to an electronic device suitable for a display device with high resolution.

2. Description of Related Art

Display devices with high resolution are the mainstream display devices commercially available. Many manufactures desires to develop display devices with higher resolution to improve the image quality.

For improving the resolution of the display devices, de-magnification of the sizes of the pixels is designed to provide clearer images. However, the requirement for materials is getting severe and the manufacturing capacities and yields may not satisfy the manufacture's expectation when the sizes of the pixels are continuously reduced.

Therefore, it is desirable to provide a novel electronic device which can be applied to display devices to meet the requirement of high resolution.

SUMMARY

The present disclosure provides an electronic device, comprising: a first substrate; a second substrate, opposite to the first substrate; a black matrix layer disposed between the first substrate and the second substrate and comprising a first pixel region and a first shielding region, wherein the first pixel region and the first shielding region are arranged along a first direction, the first pixel region comprises a first sub-pixel opening and a second sub-pixel opening arranged along a second direction, and the first direction is different from the second direction; a scan line disposed between the first substrate and the second substrate, wherein the scan line extends along the second direction, and the first shielding region overlaps the scan line; a first pixel color resist disposed corresponding to the first sub-pixel opening in the first pixel region; and a second pixel color resist disposed corresponding to the second sub-pixel opening in the first pixel region, wherein in a cross-sectional view, a recess is formed between the first pixel color resist and the second pixel color resist, the recess is disposed in the first pixel region, and the recess comprises a curved side wall.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, when a value is in a range from a first value to a second value, the value can be the first value, the second value, or another value between the first value and the second value.

In addition, the features in different embodiments of the present disclosure can be mixed to form another embodiment.

Figure 1:
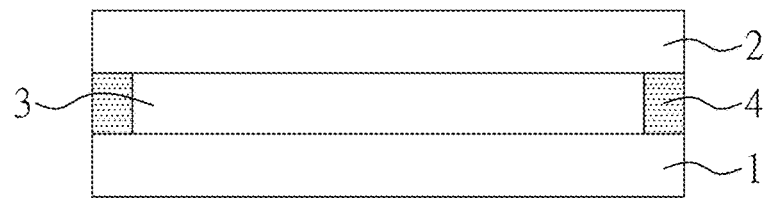
FIG. 1 is a cross-sectional view of an electronic device according to one embodiment of the present disclosure.

FIG. 1 is a cross-sectional view of an electronic device according to one embodiment of the present disclosure. The electronic device of the present embodiment is a display device, comprising: a first substrate 1; a second substrate 2 opposite to the first substrate 1; a display layer 3 disposed between the first substrate 1 and the second substrate 2; and a sealant 4 disposed between the first substrate 1 and the second substrate 2 and adjacent to the display layer 3. Herein, the first substrate 1 and the second substrate 2 can respectively be a rigid substrate, a flexible substrate, a film or a combination thereof. The material of the first substrate 1 and the second substrate 2 may respectively comprise quartz, glass, silicon wafer, sapphire, polycarbonate (PC), polyimide (PI), polypropylene (PP), polyethylene terephthalate (PET), other plastic or polymer material, or a combination thereof; but the present disclosure is not limited thereto. When the first substrate 1 or the second substrate 2 is a film, the film can be a barrier film, or an encapsulating barrier film formed by laminated inorganic-organic-inorganic insulating layers. In addition, the display layer 3 may comprise liquid crystals (LCs), organic light-emitting diodes (OLEDs), quantum dots (QDs), fluorescence material, phosphor material, light-emitting diodes (LEDs) or other display medium; but the present disclosure is not limited thereto. The LEDs can comprise a micro LED (micro light-emitting diode), a mini LED (mini light-emitting diode) according to the size thereof, or a quantum dot (QD) LED such as QLED or QDLED; but the present disclosure is not limited thereto. The size of the mini LED can be in a range from about 100 μm to about 300 μm, and the size of the micro LED can be in a range from about 1 μm to 100 μm; but the present disclosure is not limited thereto. The electronic device of the present embodiment can also be an antenna device, and the display layer can be replaced by a wavelength modulation medium which can be liquid crystals. In addition, the electronic device of the present disclosure can be a bendable or a flexible electronic device. Furthermore, the electronic device of the present disclosure can be a tiled electronic device, which can be a tiled display device, a tiled antenna device or a combination thereof.

Figure 2:
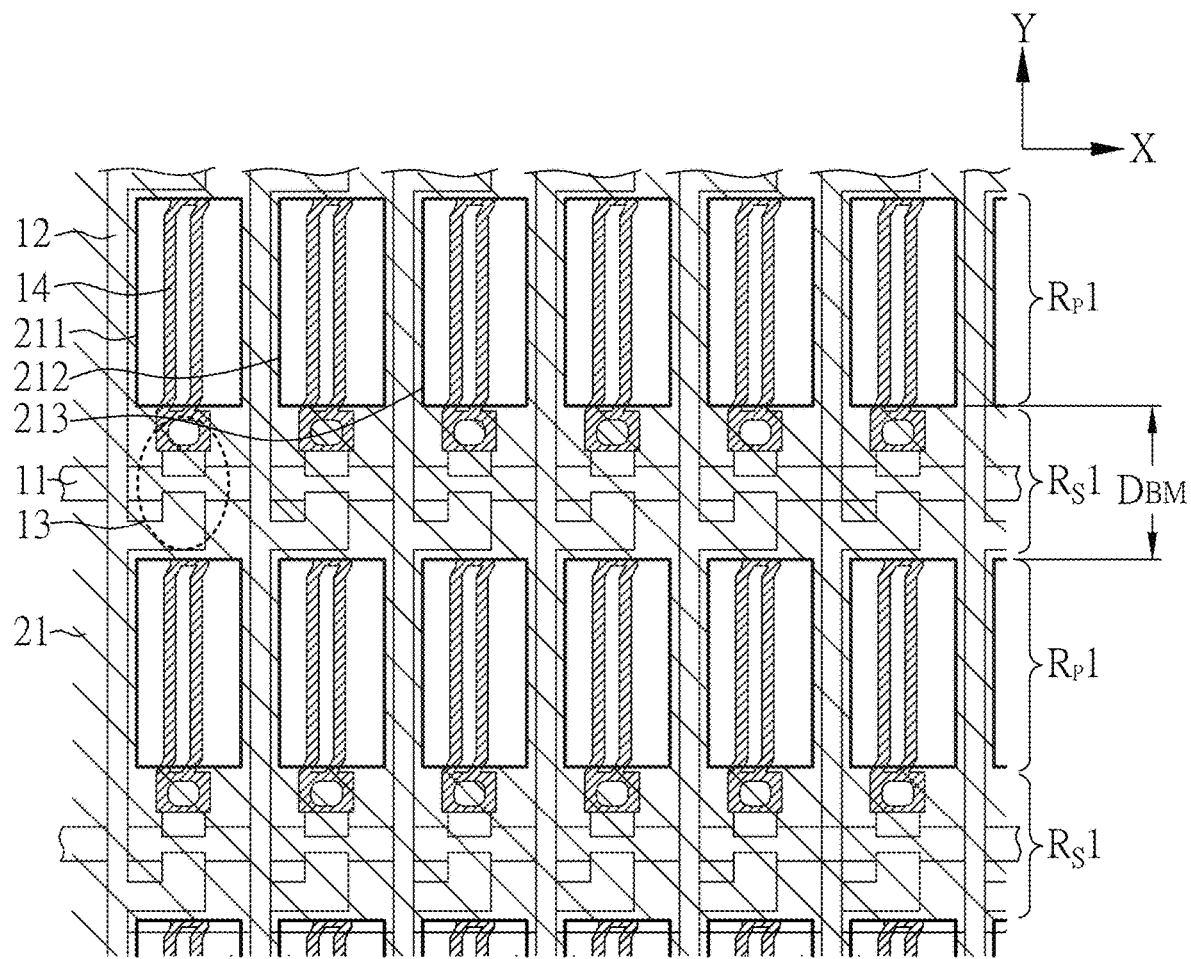
FIG. 2 is a schematic view showing a structure and a black matrix layer on a first substrate in an electronic device according to one embodiment of the present disclosure.
Figure 3:
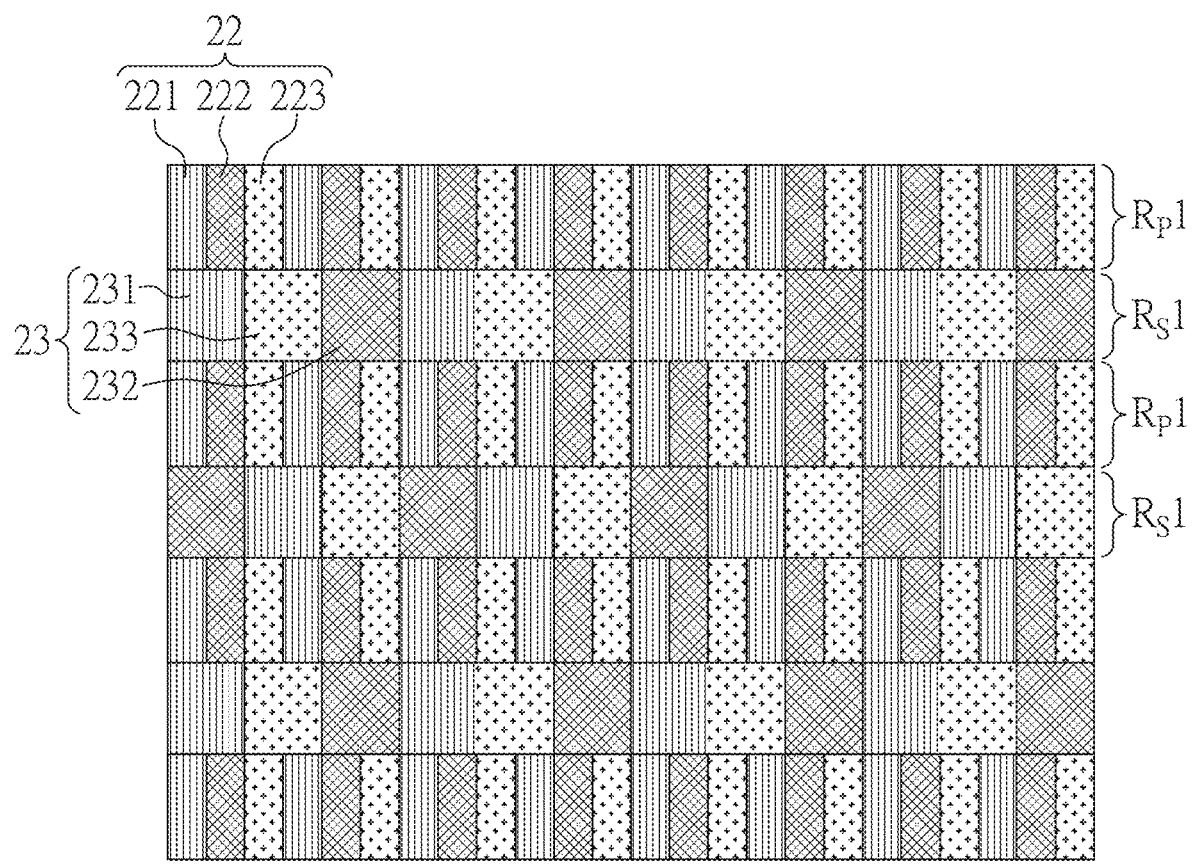
FIG. 3 is a schematic view showing a color resist layer in an electronic device according to one embodiment of the present disclosure.
Figure 4:
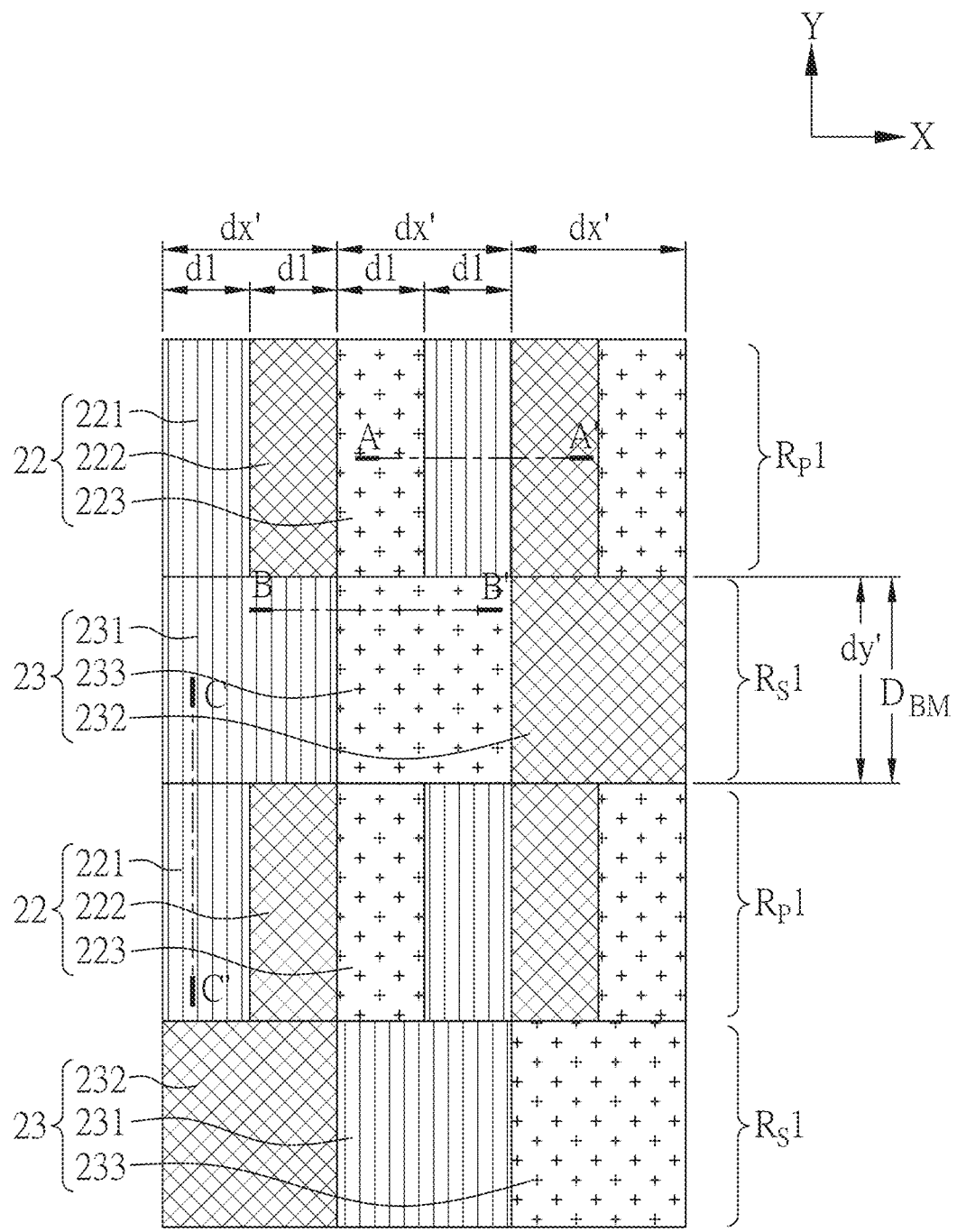
FIG. 4 is an enlarge view of a part of a color resist layer shown in FIG. 3.

Not only the display layer 3 but also other structures can be disposed between the first substrate 1 and the second substrate 2. Hereinafter, other structures disposed between the first substrate 1 and the second substrate 2 are described in detail with FIG. 2 to FIG. 4. FIG. 2 is a schematic view showing a structure and a black matrix layer on the first substrate in the electronic device of the present embodiment. FIG. 3 is a schematic view showing a color resist layer in the electronic device of the present embodiment. FIG. 4 is an enlarge view of a part of the color resist layer shown in FIG. 3.

As shown in FIG. 2, in the electronic device of the present embodiment, the first substrate 1 can be a thin film transistor (TFT) substrate on which disposed with a scan line 11, a data line 12, a transistor 13 electrically connecting to the scan line 11 and the data line 12, and a pixel electrode 14 electrically connecting to the transistor 13. A semiconductor layer included in the transistor 13 may comprise amorphous silicon, polycrystalline-silicon, or metal oxide such as IGZO (indium gallium zinc oxide), AIZO (aluminum indium zinc oxide), HIZO (hafnium indium zinc oxide), ITZO (indium tin zinc oxide), IGZTO (indium gallium zinc tin oxide), or IGTO (indium gallium tin oxide); but the present disclosure is not limited thereto. In addition, the scan line 11 and the data line 12 may respectively comprise Cu, Al, Mo, W, Au, Cr, Ni, Pt, Ti, Cu alloy, Al alloy, Mo alloy, W alloy, Au alloy, Cr alloy, Ni alloy, Pt alloy, Ti alloy, other suitable metal, a combination thereof, or other conductive material with good conductivity or small resistance; but the present disclosure is not limited thereto. The pixel electrode 14 may comprise transparent conductive metal oxide such as ITO (indium tin oxide), IZO (indium zinc oxide), ITZO (indium tin zinc oxide), IGZO (indium gallium zinc oxide) or AZO (aluminum zinc oxide); but the present disclosure is not limited thereto.

In addition, in the electronic device of the present embodiment, a black matrix layer 21 can be disposed between the first substrate 1 and the second substrate 2, and comprises plural first pixel regions Rp1 and plural first shielding regions Rs1. The first pixel regions Rp1 and the first shielding regions Rs1 are alternately disposed along a first direction Y. Herein, "the first pixel regions Rp1 and the first shielding regions Rs1 are alternately disposed along a first direction Y" refers to the situation that one first pixel region Rp1 is disposed between two adjacent first shielding regions Rs1, and no other first pixel region Rp1 is disposed between the two adjacent first shielding regions Rs1. In addition, the first pixel region Rp1 comprises a first sub-pixel opening 211 to expose the pixel electrode 14.

As shown in FIG. 1 and FIG. 3, a color resist layer can be disposed between the first substrate 1 and the second substrate 2, and comprises pixel region color resists 22 and shielding region color resists 23. The pixel region color resists 22 are disposed corresponding to the first pixel region Rp1, and comprises a first pixel color resist 221, a second pixel color resist 222 and a third pixel color resist 223. The shielding region color resists 23 are disposed corresponding to the first shielding region Rs1, and comprises a first color resist 231, a second color resist 232 and a fourth color resist 233.

Figure 5A:
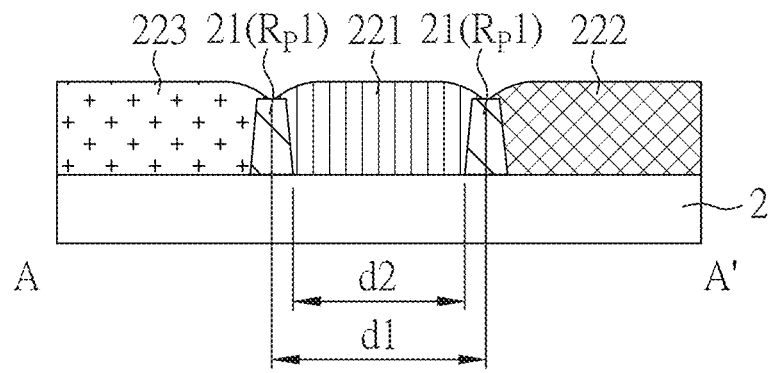
FIG. 5A to FIG. 5C are cross-sectional views according to the lines A-A', B-B' and C-C' indicated in FIG. 4 respectively.

FIG. 4 is an enlarge view of a part of the color resist layer shown in FIG. 3, and FIG. 5A is a cross-sectional view according to the line A-A' indicated in FIG. 4. Hereinafter, a relationship between the black matrix layer 21 and the color resist layer in the electronic device of the present embodiment are described with FIG. 4 accompanying with FIG. 2 and FIG. 5A. The electronic device of the present embodiment comprises: a first substrate 1 (as shown in FIG. 1); a second substrate 2 (as shown in FIG. 1) opposite to the first substrate 1; a black matrix layer 21 disposed between the first substrate 1 and the second substrate 2 and comprising a first pixel region Rp1 and a first shielding region Rs1, wherein the first pixel region Rp1 and the first shielding region Rs1 are disposed alternately along a first direction Y, and the first pixel region Rp1 comprises a first sub-pixel opening 211; a scan line 11 disposed between the first substrate 1 and the second substrate 2, wherein the scan line 11 extends along a second direction X, the first direction Y is different from the second direction X, and the first shielding region Rs1 overlaps the scan line 11; a first pixel color resist 221 disposed corresponding to the first sub-pixel opening 211; and a first color resist 231 disposed in the first shielding region Rs1. In one embodiment, a width dx' of the first color resist 231 at the second direction X can be greater than a width d1 of the first pixel color resist 221 at the second direction X, wherein the width d1 of the first pixel color resist 221 at the second direction X refers to a distance between two ends of the first pixel color resist 221 on the black matrix layer 21 in a cross section along the second direction X, and the width dx' of the first color resist 231 at the second direction X refers to a distance between two ends of the bottom of the first color resist 231 in a cross section along the second direction X. In another embodiment, a width dx' of the first color resist 231 at the second direction X can be greater than a width d2 of the first sub-pixel opening 211 at the second direction X, wherein the width d2 of the first sub-pixel opening 211 refers to a distance between two ends of the first sub-pixel opening 211 at the bottom of the first sub-pixel opening 211 in a cross section along the second direction X. In the present embodiment, a color of the first pixel color resist 221 is the same as a color of the first color resist 231, and the first pixel color resist 221 connects to the first color resist 231.

As the display device with high resolution becomes the mainstream display device in the market, the size of the first sub-pixel opening 211 is getting smaller, and the size of the first pixel color resist 221 is also getting smaller. The pigment contained in the first pixel color resist 221 may absorb light, wherein the surface layer of the first pixel color resist 221 absorb more exposure light, and the bottom layer of the first pixel color resist 221 absorb less exposure light. In this situation, the photo color resist at the bottom layer of the first pixel color resist 221 may react incompletely because the exposure energy absorbed by the bottom layer of the first pixel color resist 221 is insufficient during the photolithography process, resulting in the adhesion decreased or the undercut. Thus, the first pixel color resist 221 may be peeled off.

In the present embodiment, the width dx' of the first color resist 231 at the second direction X in the first shielding region Rs1 is designed to be greater than the width d1 of the first pixel color resist 221 at the second direction X in the first pixel region Rp1, so that the area of the first color resist 231 is increased. In another embodiment, the width dx' of the first color resist 231 at the second direction X in the first shielding region Rs1 is designed to be greater than the width d2 of the first sub-pixel opening 211 at the second direction X in the first pixel region Rp1, so that the area of the first color resist 231 is increased. Because the color of the first pixel color resist 221 is the same as the color of the first color resist 231 and the first pixel color resist 221 connects to the first color resist 231, the first pixel color resist 221 and the first color resist 231 can be formed at the same time by a single opening of a mask. In the present embodiment, an opening area of the mask is increased as the area of the first color resist 231 increased. When a photo color resist is used to form the first color resist 231 and the first pixel color resist 221, the total exposure energy is increased as the total light amount is increased by enlarging the opening area of the mask. Thus, the photo color resist can react completely, and the overall adhesion of the first color resist 231 and the first pixel color resist 221 can further be improved. The first color resist 231 can assist the fixing of the first pixel color resist 221 because the color of the first pixel color resist 221 is the same as the color of the first color resist 231 and the first pixel color resist 221 connects to the first color resist 231. Meanwhile, the overall adhesion of the first color resist 231 and the first pixel color resist 221 can be improved by increasing the adhesion area of the first color resist 231. Even though the area of the first pixel color resist 221 is small, the adhesion of the first color resist 231 with the larger area can decrease the peeling possibility of the first pixel color resist 221.

In the present disclosure, the width dx' of the first color resist 231 at the second direction X is designed to be greater than the width d1 of the first pixel color resist 221 at the second direction X or the width d2 of the first sub-pixel opening 211 at the second direction X to achieve the aforesaid effect. In one embodiment of the present disclosure, the width dx' of the first color resist 231 at the second direction X is greater than or equal to 1.5 times of the width d1 of the first pixel color resist 221 at the second direction X (dx'/d1≥1.5) and less than a width of the second substrate 2. In another embodiment, the width dx' of the first color resist 231 at the second direction X can be greater than or equal to 1.5 times of the width d2 of the first sub-pixel opening 211 at the second direction X (dx'/d2≥1.5) and less than the width of the second substrate 2. In the present embodiment, the width dx' of the first color resist 231 at the second direction X is greater than or equal to 2 times of the width d1 of the first pixel color resist 221 at the second direction X and less than the width of the second substrate 2. In another embodiment, the width dx' of the first color resist 231 at the second direction X is greater than or equal to 2 times of the width d2 of the first sub-pixel opening 211 at the second direction X and less than the width of the second substrate 2. But, the present disclosure is not limited thereto.

As shown in FIG. 2 and FIG. 4, in the present embodiment, the first pixel region Rp1 may further comprises a second sub-pixel opening 212, the second pixel color resist 222 is disposed corresponding to the second sub-pixel opening 212, a color of the second pixel color resist 222 is the same as the color of the second color resist 232, the second pixel color resist 222 connects to the second color resist 232, and a width dx' of the second color resist 232 at the second direction X is greater than a width d1 of the second pixel color resist 222 at the second direction X. In addition, the feature of the second sub-pixel opening 212 can be the same as the feature of the first sub-pixel opening 211, i.e. a width dx' of the second color resist 232 at the second direction X is greater than a width d2 of the second sub-pixel opening 212 at the second direction X. The width d2 of the second sub-pixel opening 212 is not shown in the figure, but can be referred to the width d2 of the first sub-pixel opening 211 shown in FIG. 5A. In another embodiment, the width dx' of the second color resist 232 at the second direction X can be greater than or equal to 1.5 times of the width d2 of the second sub-pixel opening 212 at the second direction X. In addition, the first pixel region Rp1 may further comprises a third sub-pixel opening 213, the third pixel color resist 223 is disposed corresponding to the third sub-pixel opening 213, a color of the third pixel color resist 223 is the same as the color of the fourth color resist 233, the third pixel color resist 223 connects to the fourth color resist 233, and a width dx' of the fourth color resist 233 at the second direction X is greater than a width d1 of the third pixel color resist 223 at the second direction X. In addition, the feature of the third sub-pixel opening 213 can be the same as the feature of the first sub-pixel opening 211, i.e. a width dx' of the fourth color resist 233 at the second direction X is greater than a width d2 of the third sub-pixel opening 213 at the second direction X. The width d2 of the third sub-pixel opening 213 is not shown in the figure, but can be referred to the width d2 of the first sub-pixel opening 211 shown in FIG. 5A. In another embodiment, the width dx' of the fourth color resist 233 at the second direction X can be greater than or equal to 1.5 times of the width d2 of the third sub-pixel opening 213. In the present embodiment, the relation between the second pixel color resist 222 and the second color resist 232 and/or the relation between the third pixel color resist 223 and the fourth color resist 233 can be the same as or similar to the relation between the first pixel color resist 221 and the first color resist 231, and is not repeated again.

In addition, as shown in FIG. 2 and FIG. 4, the disposition position of the first color resist 231, the second color resist 232 and the fourth color resist 233 of the first shielding region Rs1 cannot be exposed from the first sub-pixel opening 211, the second sub-pixel opening 212 and the third sub-pixel opening 213. In other words, a width dy' of the first color resist 231, the second color resist 232 and the fourth color resist 233 of the first shielding region Rs1 at the first direction Y has to be equal to or smaller than a width $D_{BM}$ of the first shielding region Rs1 at the first direction Y ($dy' \leq D_{BM}$).

In the present embodiment, the first pixel color resist 221 and the first color resist 231 are red color resists, the second pixel color resist 222 and the second color resist 232 are green color resists, and the third pixel color resist 223 and the fourth color resist 233 are blue color resists; but the present disclosure is not limited thereto. The first pixel color resist 221 and the first color resist 231 have the same color, the second pixel color resist 222 and the second color resist 232 have the same color, the third pixel color resist 223 and the fourth color resist 233 have the same color, the first pixel color resist 221, the second pixel color resist 222 and the third pixel color resist 223 have different colors, and the first color resist 231, the second color resist 232 and the fourth color resist 233 have different colors.

Figure 5B:
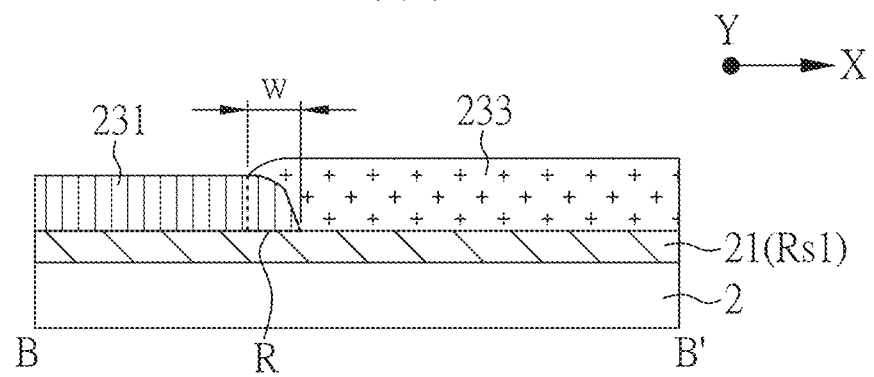
Figure 5C:
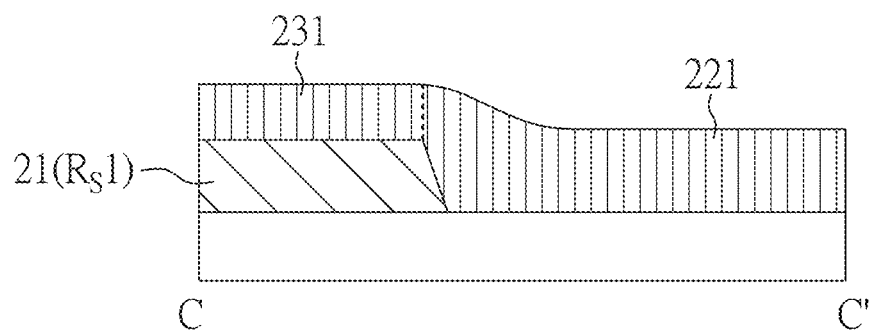

FIG. 5A to FIG. 5C are cross-sectional views according to the lines A-A', B-B' and C-C' indicated in FIG. 4 respectively. As shown in FIG. 5A, in the electronic device of the present embodiment, the first pixel color resist 221, the second pixel color resist 222 and the third pixel color resist 223 are disposed on the second substrate 2, and the black matrix layer 21 is also disposed on the second substrate 2. The first pixel region Rp1 of the black matrix layer 21 is disposed between the first pixel color resist 221 and the second pixel color resist 222, between the second pixel color resist 222 and the third pixel color resist 223, and also between the first pixel color resist 221 and the third pixel color resist 223. In addition, the first pixel color resist 221, the second pixel color resist 222 and the third pixel color resist 223 may cover a part of the first pixel region Rp1. In another embodiment of the present disclosure, the first pixel color resist 221, the second pixel color resist 222 and the third pixel color resist 223 may not cover the first shielding region Rs1. In further another embodiment of the present disclosure, in the first pixel region Rp1, the first pixel color resist 221 and the second pixel color resist 222 can be overlapped, the second pixel color resist 222 and the third pixel color resist 223 can be overlapped, or the first pixel color resist 221 and the third pixel color resist 223 can be overlapped. In addition, the first pixel color resist 221 and the second pixel color resist 222 can be overlapped along the first direction Y or the second direction X. But, the present disclosure is not limited thereto.

As shown in FIG. 5B, in the electronic device of the present embodiment, the first color resist 231, the second color resist 232 (as shown in FIG. 4) and the fourth color resist 233 are also disposed on the second substrate 2. The first color resist 231, the second color resist 232 and the fourth color resist 233 are disposed in the first shielding region Rs1. The color of the first color resist 231 is different from the color of the second color resist 232, and the first color resist 231 overlaps the second color resist 232 in the first shielding region Rs1 to form an overlapping region R. As shown in FIG. 5A and FIG. 5B, a width w of the overlapping region R at the second direction X is greater than or equal to 0 and less than 50% of the width d1 (shown in FIG. 5A) of the first pixel color resist 221 at the second direction X. In another embodiment, the width w of the overlapping region R at the second direction X is greater than or equal to 0 and less than 50% of the width d2 (shown in FIG. 5A) of the first sub-pixel opening 211 at the second direction X. FIG. 5B is provided as an example, in which the width w of the overlapping region R refers to a distance between a end of the first color resist 231 to an end of the fourth color resist 233 at the second direction X. More specifically, the width w is greater than or equal to 0% of the width d1 and less than 50% of the width d1 ($0\% \leq (w/d1) \times 100\% < 50\%$), the width w is greater than or equal to 0% of the width d1 and less than 40% of the width d1 ($0\% \leq (w/d1) \times 100\% < 40\%$), the width w is greater than or equal to 0% of the width d1 and less than 30% of the width d1 ($0\% \leq (w/d1) \times 100\% < 30\%$), the width w is greater than or equal to 0% of the width d1 and less than 20% of the width d1 ($0\% \leq (w/d1) \times 100\% < 20\%$), or the width w is greater than or equal to 0% of the width d1 and less than 10% of the width d1 ($0\% \leq (w/d1) \times 100\% < 10\%$). In another embodiment, the width w of the overlapping region R at the second direction X can be greater than or equal to 0 and less than 50% of the width d2 (as shown in FIG. 5A) of the first sub-pixel opening 211 at the second direction X. More specifically, the width w is greater than or equal to 0% of the width d2 and less than 50% of the width d2 ($0\% \leq (w/d2) \times 100\% < 50\%$), the width w is greater than or equal to 0% of the width d2 and less than 40% of the width d2 ($0\% \leq (w/d2) \times 100\% < 40\%$), the width w is greater than or equal to 0% of the width d2 and less than 30% of the width d2 ($0\% (w/d2) \times 100\% < 30\%$), the width w is greater than or equal to 0% of the width d2 and less than 20% of the width d2 ($0\% \leq (w/d2) \times 100\% < 20\%$), or the width w is greater than or equal to 0% of the width d2 and less than 10% of the width d2 ($0\% \leq (w/d2) \times 100\% < 10\%$). Even not shown in the figure, two adjacent first color resist 231 and second color resist 232 or two adjacent second color resist 232 and fourth color resist 233 can be overlapped in the first shielding region Rs1 to form another overlapping region. The relation between the width w of this overlapping region and the width d1 or between the width w of this overlapping region and the width d2 are similar to that described above, and is not repeated again.

In the present embodiment, because the first color resist 231, the second color resist 232 and the fourth color resist 233 are disposed in the first shielding region Rs1, the color mixing problem is not occurred even though the first color resist 231, the second color resist 232 and the fourth color resist 233 are overlapped. When two adjacent first color resist 231 and second color resist 232 are overlapped, two adjacent second color resist 232 and fourth color resist 233 are overlapped or two adjacent first color resist 231 and fourth color resist 233 are overlapped, the adhesion between the color resists can be improved by the partial overlapping of two adjacent color resists. Thus, the peeling problem of the color resists can be prevented.

As shown in FIG. 5C, the first pixel color resist 221 and the first color resist 231 are adjacent and have the same color, so the first color resist 231 can assist the fixing of the first pixel color resist 221 to reduce the peeling probability of the first pixel color resist 221. Similarly, even not shown in the figure, in other cross section of the present embodiment, the second pixel color resist 222 and the second color resist 232 are adjacent and have the same color and the third pixel color resist 223 and the fourth color resist 233 are adjacent and have the same color, so the peeling probability of the second pixel color resist 222 and the third pixel color resist 223 can also be reduced.

Figure 6:
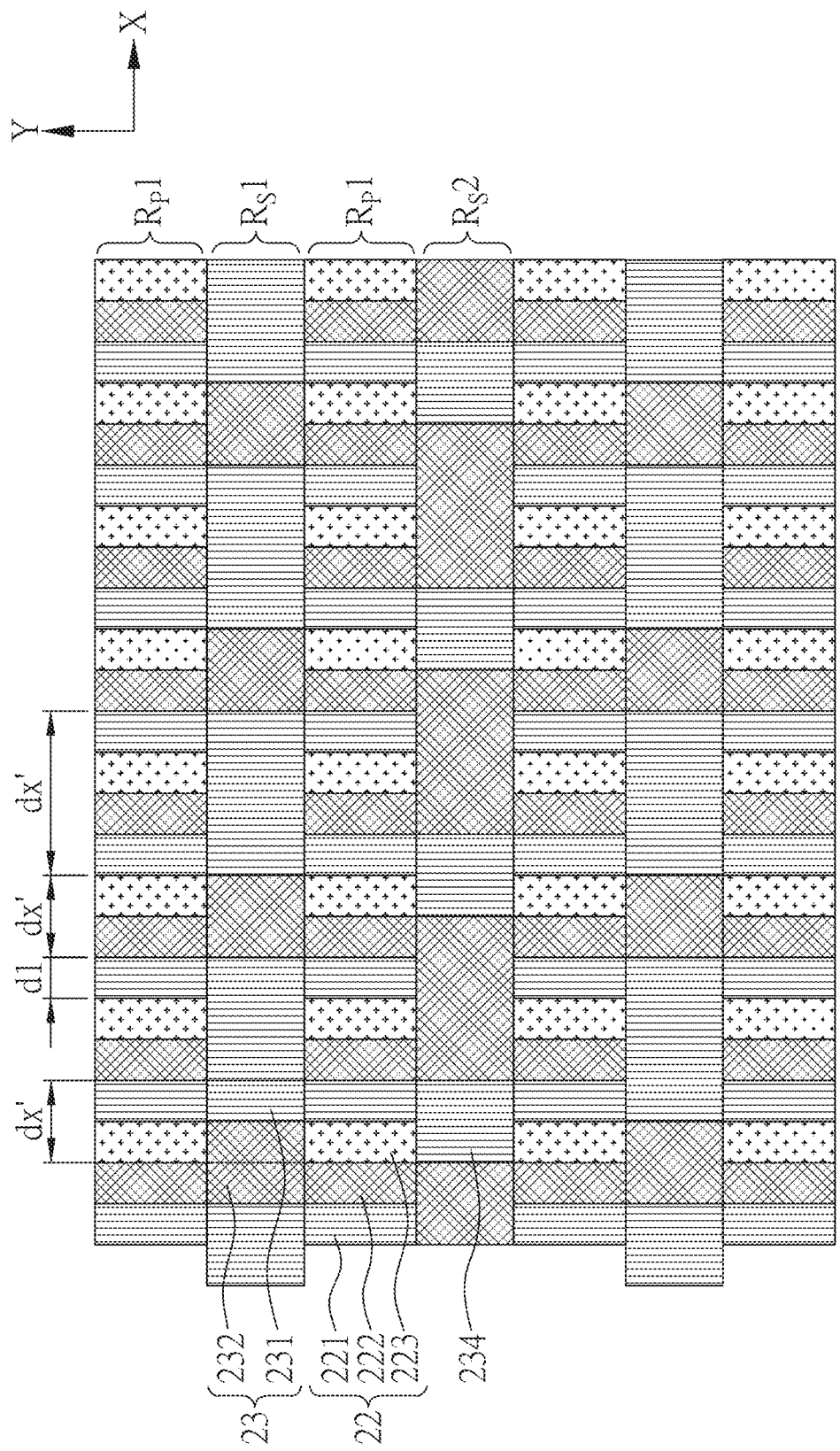
FIG. 6 is a schematic view showing a color resist layer in an electronic device according to another embodiment of the present disclosure.

FIG. 6 is a schematic view showing a color resist layer in an electronic device according to another embodiment of the present disclosure. The electronic device of the present embodiment is similar to that shown in FIG. 3, except for the pattern of the color resist layer.

In the present embodiment, the color resists of the first shielding region Rs1 only comprise the first color resist 231 and the second color resist 232. The first color resist 231 and the first pixel color resist 221 have the same color and connect to each other. The width dx' of the first color resist 231 at the second direction X is 4 times of the width d1 of the first pixel color resist 221 at the second direction X. The second color resist 232 and the second pixel color resist 222 have the same color and connect to each other. The width dx' of the second color resist 232 at the second direction X is 2 times of the width d1 of the second pixel color resist 222 at the second direction X. In addition, the width dx' of the first color resist 231 at the second direction X can also be 4 times of the width d2 of the first sub-pixel opening 211 at the second direction X, and the width dx' of the second color resist 232 at the second direction X can also be 2 times of the width d2 of the second sub-pixel opening 212 at the second direction X.

Furthermore, in the present embodiment, the black matrix layer (not shown in the figure) further comprise a second shielding region Rs2, and the first shielding region Rs1, the first pixel region Rp1 and the second shielding region Rs2 are disposed alternately along the first direction Y, and the first pixel region Rp1 is disposed between the first shielding region Rs1 and the second shielding region Rs2. The electronic device of the present embodiment further comprises a third color resist 234 disposed in the second shielding region Rs, a color of the third color resist 234 is the same as the color of the first pixel color resist 221, the third color resist 234 connects to the first pixel color resist 221, and a width dx' of the third color resist 234 at the second direction X is greater than the width d1 of the first pixel color resist 221 at the second direction X. For example, the width dx' of the third color resist 234 at the second direction X is greater than or equal to 1.5 times of the width d1 of the first pixel color resist 221 at the second direction X. In the present embodiment, the width dx' of the third color resist 234 at the second direction X is 2 times of the width d1 of the first pixel color resist 221 at the second direction X. In another embodiment, the width dx' of the third color resist 234 at the second direction X can be greater than the width d2 of the first sub-pixel opening 211 at the second direction X. For example, the width dx' of the third color resist 234 at the second direction X is greater than or equal to 1.5 times of the width d2 of the first sub-pixel opening 211 at the second direction X. In the present embodiment, the width dx' of the third color resist 234 at the second direction X is 2 times of the width d2 of the first sub-pixel opening 211 at the second direction X.

In the present embodiment, for the first pixel color resist 221, the first shielding region Rs1 and the second shielding region Rs2 at two sides of the first pixel color resist 221 are respectively disposed with the first color resist 231 and the third color resist 234, which have the same color as the first pixel color resist 221 and connects to the first pixel color resist 221. Hence, the first color resist 231 and the third color resist 234 disposed at two sides of the first pixel color resist 221 can assist the fixing of the first pixel color resist 221 to reduce the peeling probability of the first pixel color resist 221. Similarly, the design of the second pixel color resist 222 is the same as that of the first pixel color resist 221, and is not repeated again. In the present embodiment, the first pixel color resist 221, the first color resist 231 and the third color resist 234 are red color resists, the second pixel color resist 222 and the second color resist 232 are green color resists, and the third pixel color resist 223 is a blue color resist. But, the present disclosure is not limited thereto.

Figure 7:
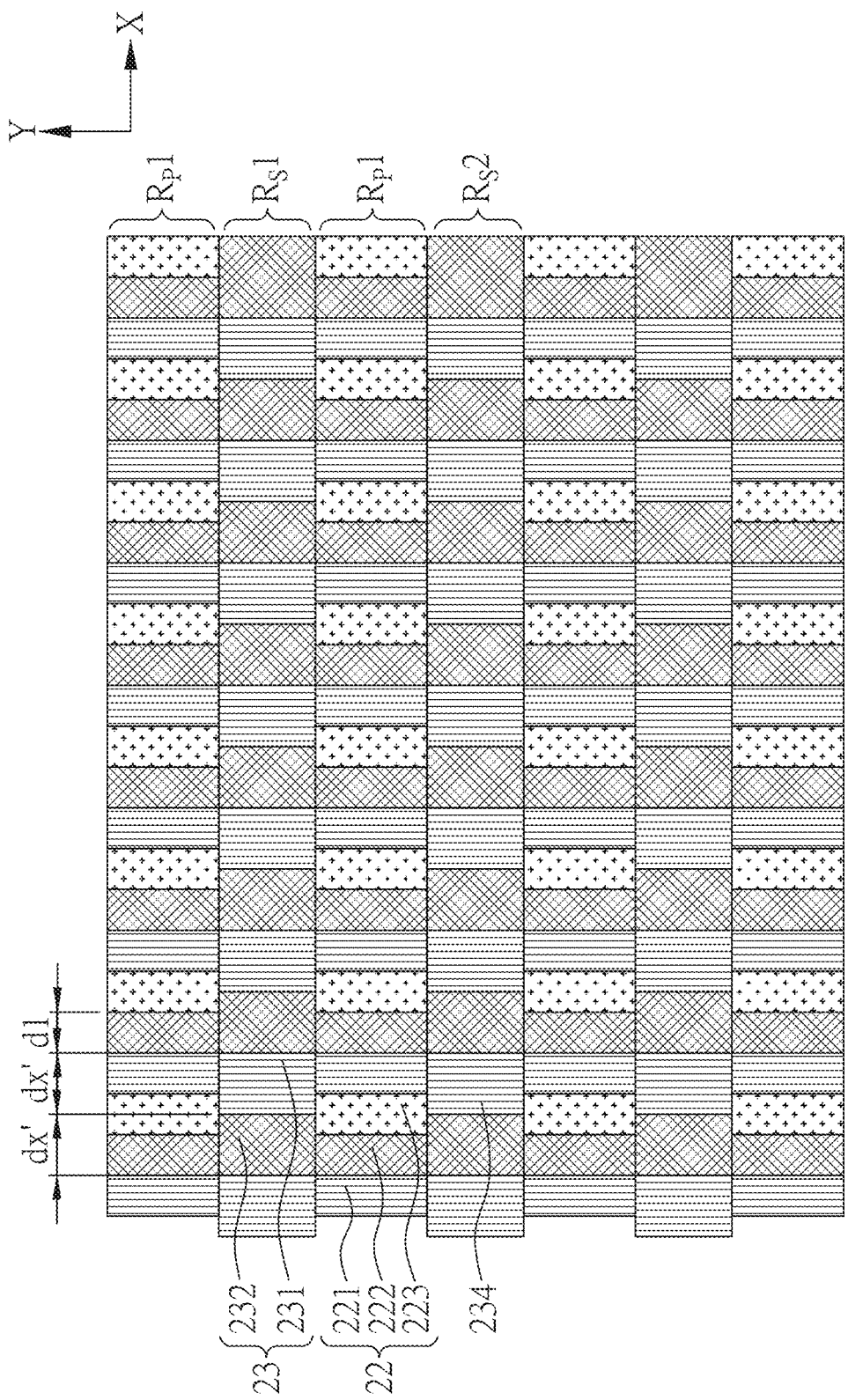
FIG. 7 is a schematic view showing a color resist layer in an electronic device according to another embodiment of the present disclosure.

FIG. 7 is a schematic view showing a color resist layer in an electronic device according to another embodiment of the present disclosure. The electronic device of the present embodiment is similar to that shown in FIG. 6, except for the pattern of the color resist layer. In the present embodiment, the overall adhesion of the first pixel color resist 221 can be improved by the first color resist 231, and the overall adhesion of the second pixel color resist 222 can be improved by the second color resist 232. Thus, the peeling probability of the first pixel color resist 221 and the second pixel color resist 222 can be reduced. Even though the area of the first pixel color resist 221 is small, the adhesion of the first pixel color resist 221 can be increased by increasing the color resist area with the first color resist 231 having larger adhesion area, so that the peeling probability of the first pixel color resist 221 can be reduced. Similarly, even though the area of the second pixel color resist 222 is small, the adhesion of the second pixel color resist 222 can be increased by increasing the color resist area with the second color resist 232 having larger adhesion area, so that the peeling probability of the second pixel color resist 222 can be reduced.

In the present embodiment, the widths dx' of the first color resist 231 and the third color resist 234 at the second direction X are 1.5 times of the width d1 of the first pixel color resist 221 at the second direction X, and the width dx' of the second color resist 232 at the second direction X is 1.5 times of the width d1 of the second pixel color resist 222 at the second direction X. In another embodiment, the widths dx' of the first color resist 231 and the third color resist 234 at the second direction X are 1.5 times of the width d2 of the first sub-pixel opening 211 at the second direction X, and the width dx' of the second color resist 232 at the second direction X is 1.5 times of the width d2 of the second sub-pixel opening 212 at the second direction X.

Figure 8:
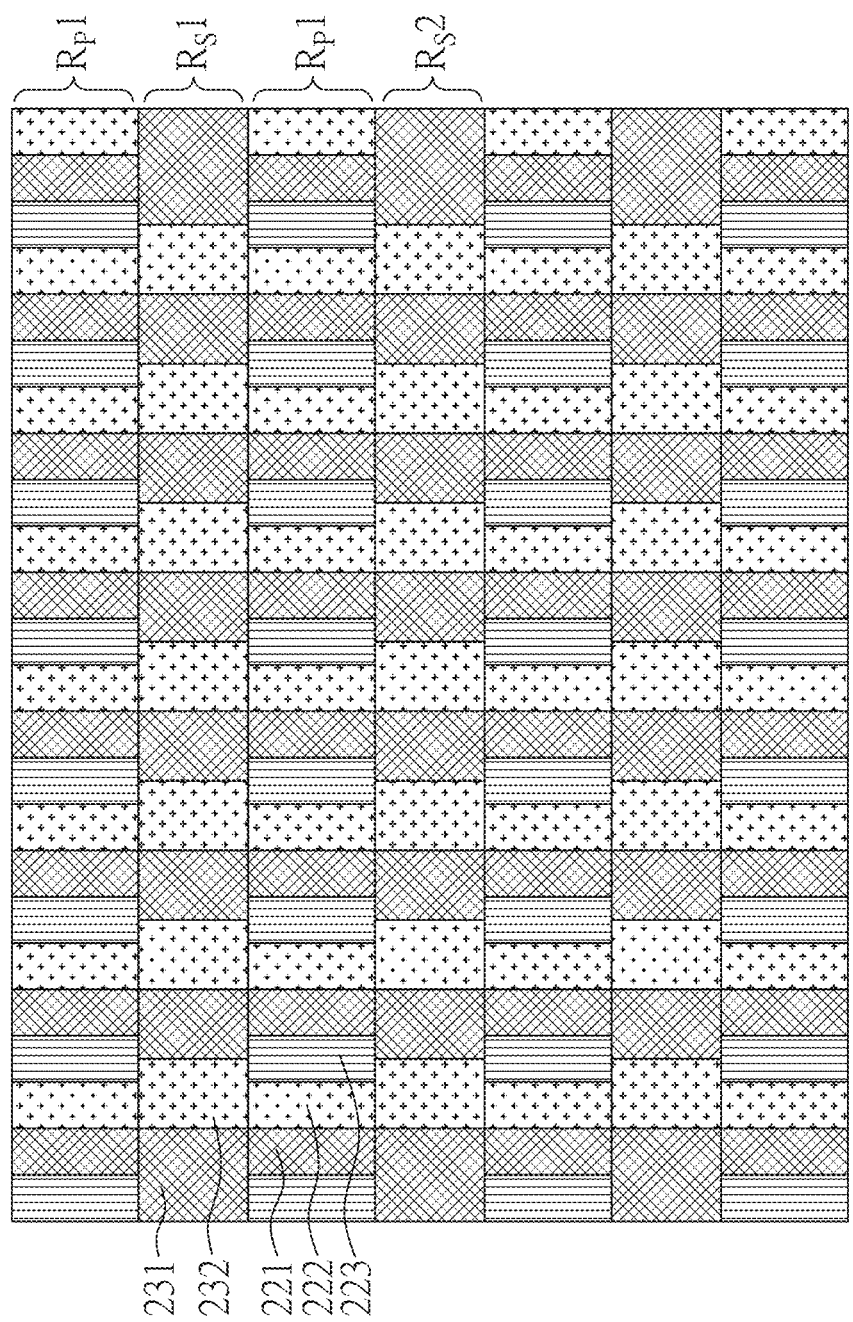
FIG. 8 is a schematic view showing a color resist layer in an electronic device according to another embodiment of the present disclosure.

FIG. 8 is a schematic view showing a color resist layer in an electronic device according to another embodiment of the present disclosure. The electronic device of the present embodiment is similar to that shown in FIG. 7, except for the pattern of the color resist layer. In the present embodiment, the overall adhesion of the first pixel color resist 221 can be improved by the first color resist 231, and the overall adhesion of the third pixel color resist 223 can be improved by the second color resist 232. Thus, the peeling probability of the first pixel color resist 221 and the second pixel color resist 223 can be reduced. Even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced. Similarly, even though the area of the second pixel color resist 222 is small, the adhesion of the second pixel color resist 222 can be improved by increasing the color resist area with the second color resist 232 having larger adhesion area, so that the peeling probability of the second pixel color resist 222 can be reduced.

In FIG. 7, the first color resist 231 is a red color resist and the second color resist 232 is a green color resist. The first pixel color resist 221 is a red color resist, the second pixel color resist 222 is a green color resist and the third pixel color resist 223 is a blue color resist.

In the present embodiment, as shown in FIG. 8, the first color resist 231 is a green color resist and the second color resist 232 is a blue color resist. The first pixel color resist 221 is a green color resist, the second pixel color resist 222 is a blue color resist and the third pixel color resist 223 is a red color resist. But, the present disclosure is not limited thereto.

Figure 9:
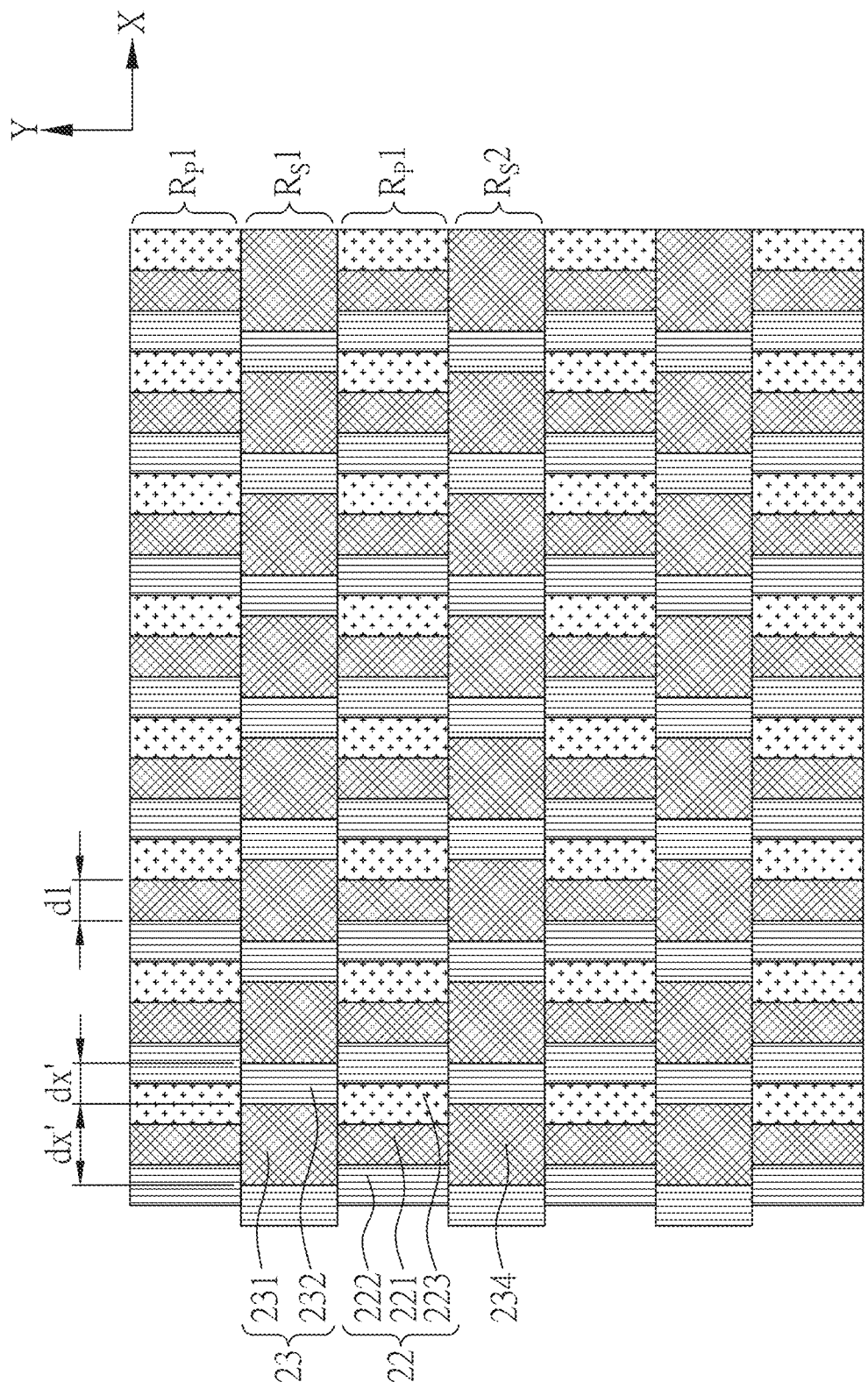
FIG. 9 is a schematic view showing a color resist layer in an electronic device according to another embodiment of the present disclosure.

FIG. 9 is a schematic view showing a color resist layer in an electronic device according to another embodiment of the present disclosure. The electronic device of the present embodiment is similar to that shown in FIG. 6, except for the pattern of the color resist layer. When the first pixel color resist 221 has to have larger adhesion than the third pixel color resist 223 due to the material property of the first pixel color resist 221, even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced. Similarly, when the second pixel color resist 222 has to have larger adhesion than the third pixel color resist 223 due to the material property of the second pixel color resist 222, even though the area of the second pixel color resist 222 is small, the adhesion of the second pixel color resist 222 can be improved by increasing the color resist area with the second color resist 232 having larger adhesion area, so that the peeling probability of the second pixel color resist 222 can be reduced.

In the present embodiment, the width dx' of the first color resist 231 at the second direction X is 2 times of the width d1 of the first pixel color resist 221 at the second direction X, but the width dx' of the second color resist 232 at the second direction X is the same as the width d1 of the second pixel color resist 222 at the second direction X. In addition, the width dx' of the third color resist 234 at the second direction X is 2 times of the width d1 of the first pixel color resist 221 at the second direction X. In another embodiment, the width dx' of the first color resist 231 at the second direction X can be 2times of the width d2 of the first sub-pixel opening 211 at the second direction X, but the width dx' of the second color resist 232 at the second direction X can be the same as the width d2 of the second sub-pixel opening 212 at the second direction X. In addition, the width dx' of the third color resist 234 at the second direction X can be 2 times of the width d2 of the first sub-pixel opening 211 at the second direction X.

In the present embodiment, the arrangement of the first color resist 231, the second color resist 232 and the third color resist 234 is mismatched the arrangement of the first pixel color resist 221 and the second pixel color resist 222. In the present embodiment, even though the color resists in the first pixel region Rp1 are disposed to mismatch the color resists in the first shielding region Rs1 and the second shielding region Rs2, two sides of the first pixel color resist 221 are disposed with the first color resist 231 in the first shielding region Rs1 and the third color resist 234 in the second shielding region Rs2, wherein the first color resist 231 and the third color resist 234 have the same color as the first pixel color resist 221 and connect to the first pixel color resist 221. In addition, the areas of the first color resist 231 and the third color resist 234 are larger than the area of the first pixel color resist 221. Hence, the peeling probability of the first pixel color resist 221 can also be reduced.

In the present embodiment, the first color resist 231 and the third color resist 234 are green color resists, and the second color resist 232 is a red color resist. The first pixel color resist 221 is a green color resist, the second pixel color resist 222 is a red color resist and the third pixel color resist 223 is a blue color resist. But, the present disclosure is not limited thereto.

Figure 10:
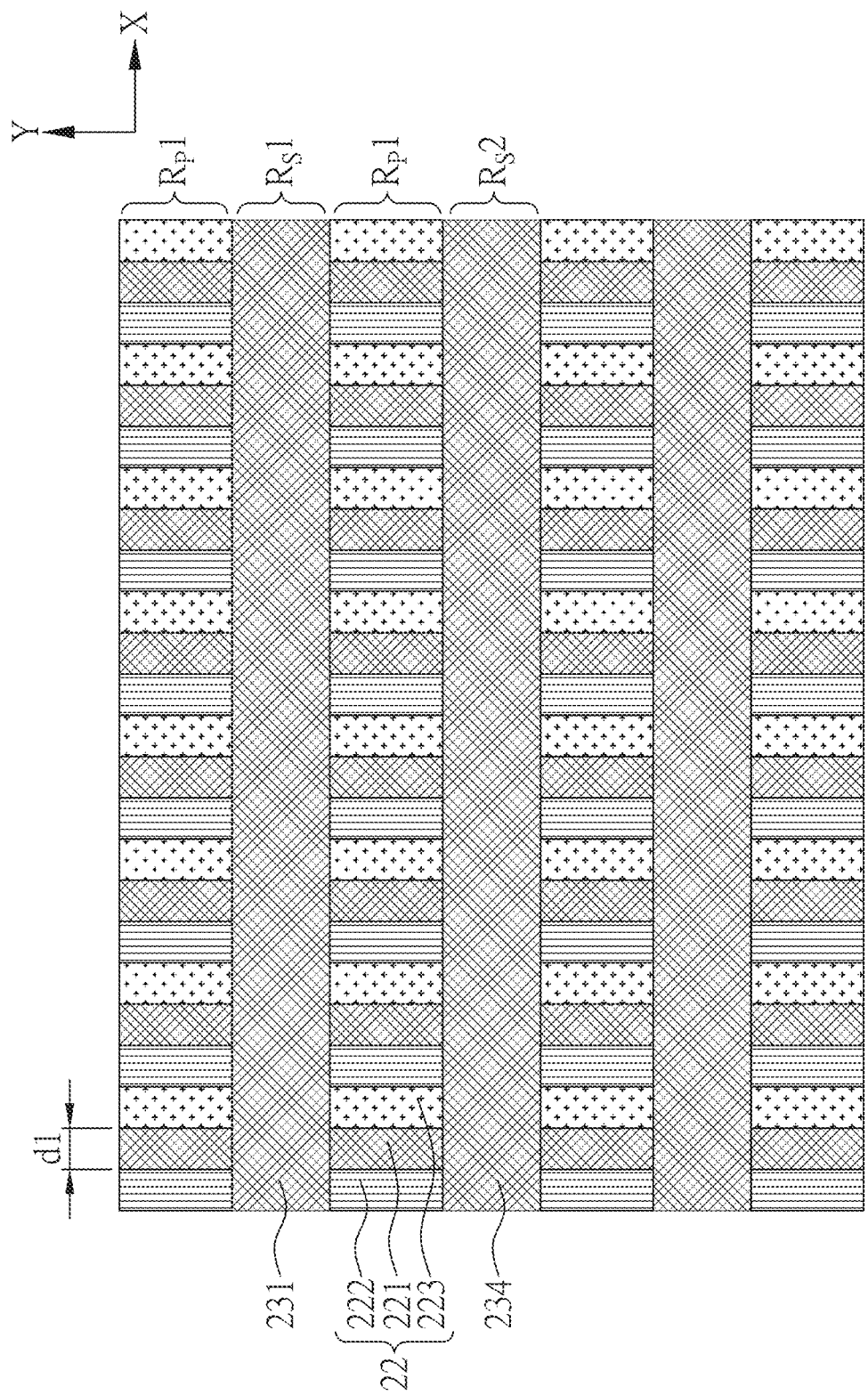
FIG. 10 is a schematic view showing a color resist layer in an electronic device according to another embodiment of the present disclosure.

FIG. 10 is a schematic view showing a color resist layer in an electronic device according to another embodiment of the present disclosure. The electronic device of the present embodiment is similar to that shown in FIG. 6, except for the pattern of the color resist layer. When the first pixel color resist 221 has to have larger adhesion than the second pixel color resist 222 due to the material property of the first pixel color resist 221, even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced.

In the present embodiment, the color resist in the first shielding region Rs1 only comprises the first color resist 231. The first color resist 231 and the first pixel color resist 221 have the same color and connect to each other. The width of the first color resist 231 at the second direction X is dozens, hundreds, thousands or more times of the width d1 of the first pixel color resist 221 at the second direction X depending upon the size of the electronic device; or the width of the first color resist 231 at the second direction X is dozens, hundreds, thousands or more times of the width d2 of the first sub-pixel opening 211 at the second direction X depending upon the size of the electronic device.

In addition, the third color resist 234 in the second shielding region Rs2 and the first pixel color resist 221 are also have the same color and connects to each other. The width of the third color resist 234 at the second direction X is dozens, hundreds, thousands or more times of the width d1 of the first pixel color resist 221 at the second direction X depending upon the size of the electronic device; or the width of the third color resist 234 at the second direction X is dozens, hundreds, thousands or more times of the width d2 of the first sub-pixel opening 211 at the second direction X depending upon the size of the electronic device.

In the present embodiment, the first color resist 231 and the third color resist 234 are green color resists. The first pixel color resist 221 is a green color resist, the second pixel color resist 222 is a red color resist and the third pixel color resist 223 is a blue color resist. But, the present disclosure is not limited thereto.

Figure 11:
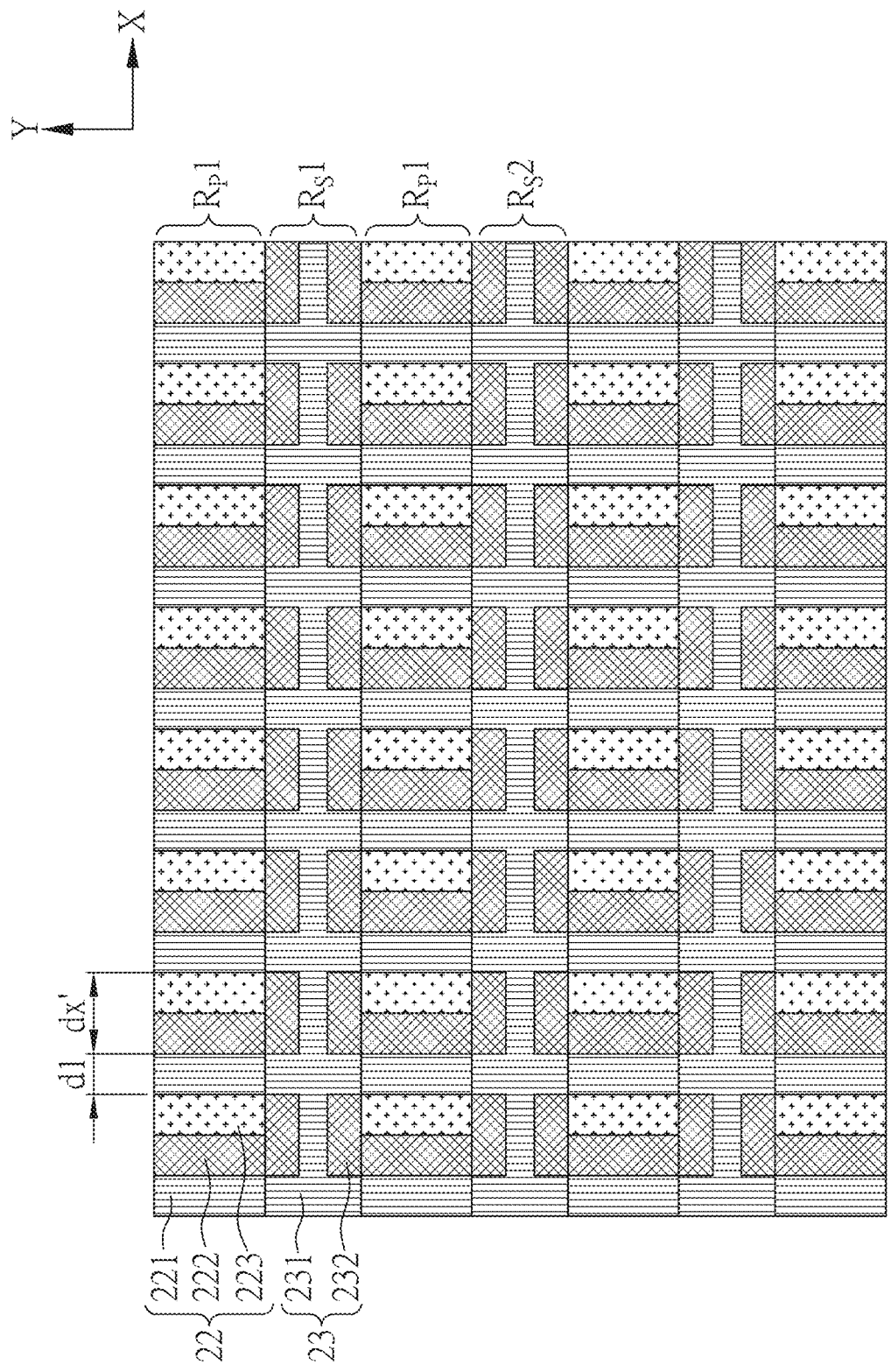
FIG. 11 is a schematic view showing a color resist layer in an electronic device according to another embodiment of the present disclosure.

FIG. 11 is a schematic view showing a color resist layer in an electronic device according to another embodiment of the present disclosure. The electronic device of the present embodiment is similar to that shown in FIG. 10, except for the pattern of the color resist layer. When the first pixel color resist 221 has to have larger adhesion than the second pixel color resist 222 due to the material property of the first pixel color resist 221, even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced. Similarly, when the second pixel color resist 222 has to have larger adhesion than the third pixel color resist 223 due to the material property of the second pixel color resist 222, even though the area of the second pixel color resist 222 is small, the adhesion of the second pixel color resist 222 can be improved by increasing the color resist area with the second color resist 232 having larger adhesion area, so that the peeling probability of the second pixel color resist 222 can be reduced.

In the present embodiment, the first color resist 231 has a repeated cross type. The color resist in the first shielding region Rs1 comprises not only the first color resist 231 but also the second color resist 232. Herein, the width dx' of the second color resist 232 at the second direction X is 2 times of the width d1 of the second pixel color resist 222 at the second direction X. In another embodiment, the width dx' of the second color resist 232 at the second direction X can be 2 times of the width d2 of the second sub-pixel opening 212 at the second direction X. But, the present disclosure is not limited thereto. In addition, the pattern of the second shielding region Rs2 is the same as the pattern of the first shielding region Rs1.

In the present embodiment, the first pixel color resist 221 and the first color resist 231 are red color resists, the second pixel color resist 222 and the second color resist 232 are green color resists, and the third pixel color resist 223 is a blue color resist. But, the present disclosure is not limited thereto.

Figure 12:
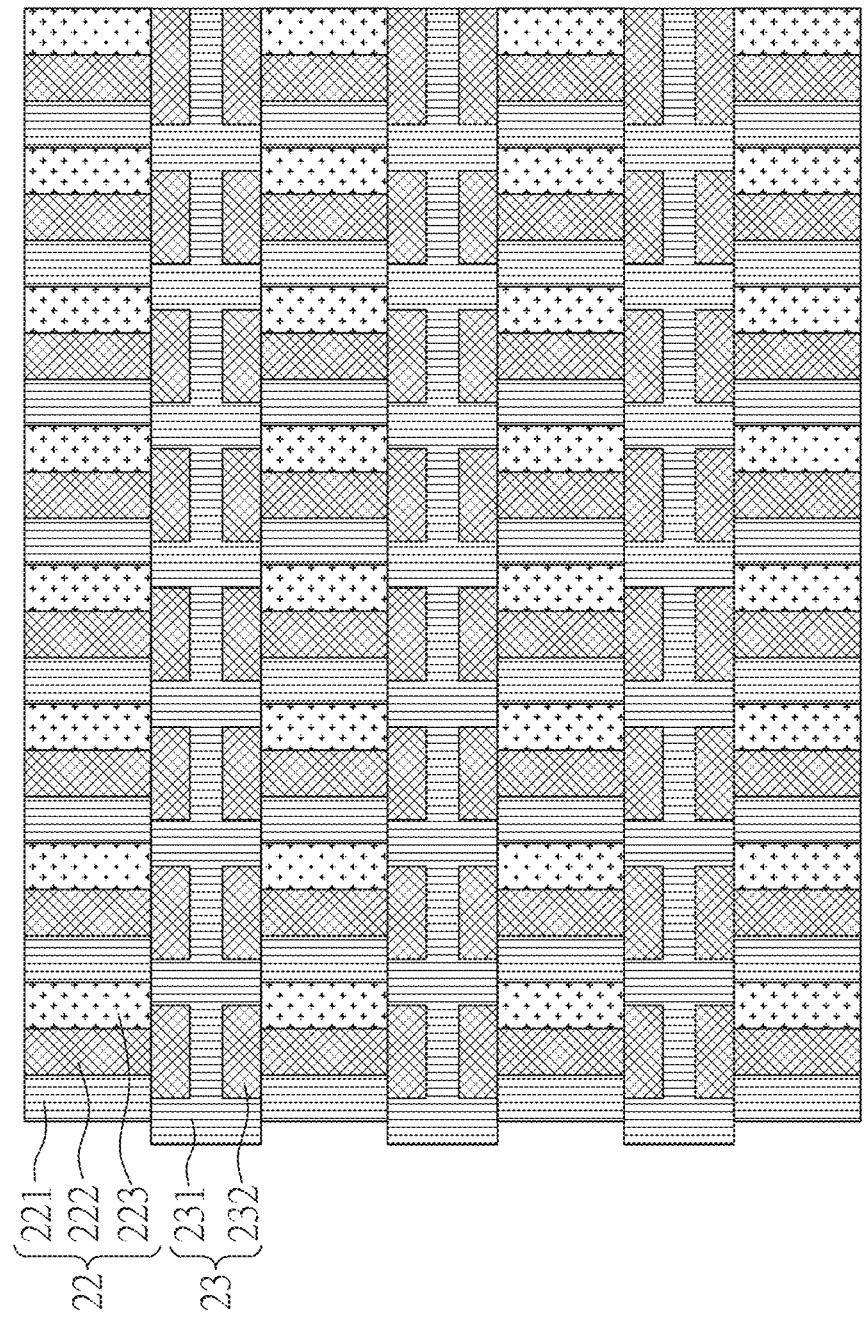
FIG. 12 is a schematic view showing a color resist layer in an electronic device according to another embodiment of the present disclosure.

FIG. 12 is a schematic view showing a color resist layer in an electronic device according to another embodiment of the present disclosure. The electronic device of the present embodiment is similar to that shown in FIG. 11, except for the pattern of the color resist layer. When the first pixel color resist 221 has to have larger adhesion than the second pixel color resist 222 due to the material property of the first pixel color resist 221, even though the area of the first pixel color resist 221 is small, the adhesion of the first pixel color resist 221 can be improved by increasing the color resist area with plural first color resists 231 connecting to each other to form a grid distribution, so that the peeling probability of the first pixel color resist 221 can be reduced. Similarly, when the second pixel color resist 222 has to have larger adhesion than the third pixel color resist 223 due to the material property of the second pixel color resist 222, even though the area of the second pixel color resist 222 is small, the adhesion of the second pixel color resist 222 can be improved by increasing the color resist area with the second color resist 232 having larger adhesion area, so that the peeling probability of the second pixel color resist 222 can be reduced.

In the present embodiment, the arrangement of the first color resist 231 and the second color resist 232 is mismatched the arrangement of the first pixel color resist 221 and the second pixel color resist 222. The first color resist 231 and the first pixel color resist 221 still have the same color and connect to each other, and the second color resist 232 and the second pixel color resist 222 also have the same color and connect to each other.

Figure 13:
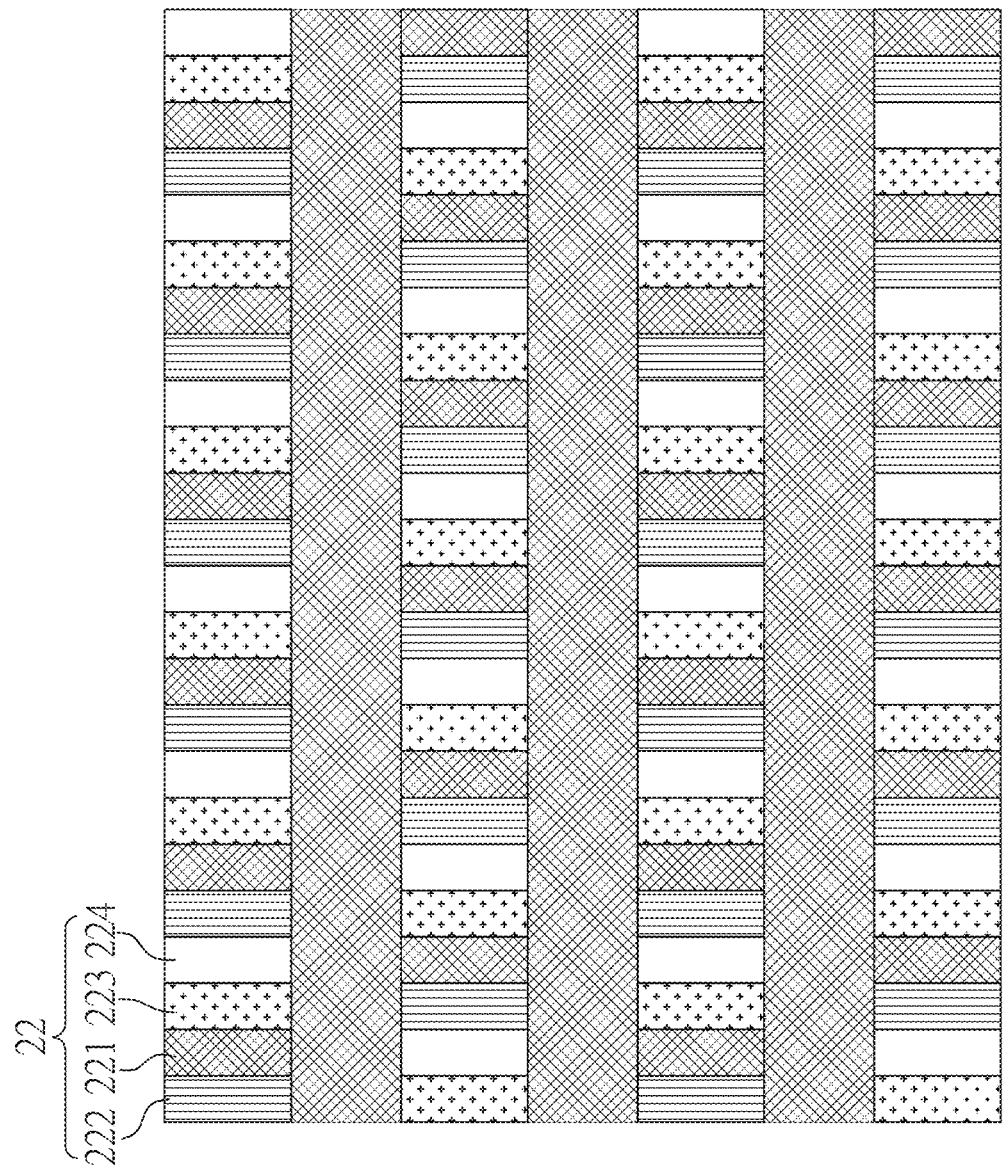
FIG. 13 is a schematic view showing a color resist layer in an electronic device according to another embodiment of the present disclosure.

FIG. 13 is a schematic view showing a color resist layer in an electronic device according to another embodiment of the present disclosure. The electronic device of the present embodiment is similar to that shown in FIG. 10, except for the pattern of the color resist layer. When the first pixel color resist 221 has to have larger adhesion due to the material property of the first pixel color resist 221, even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced.

In the present embodiment, the pixel region color resists 22 further comprises a fourth pixel color resist 224. Herein, the fourth pixel color resist 224 is a transparent color resist, but the present disclosure is not limited thereto.

Figure 14:
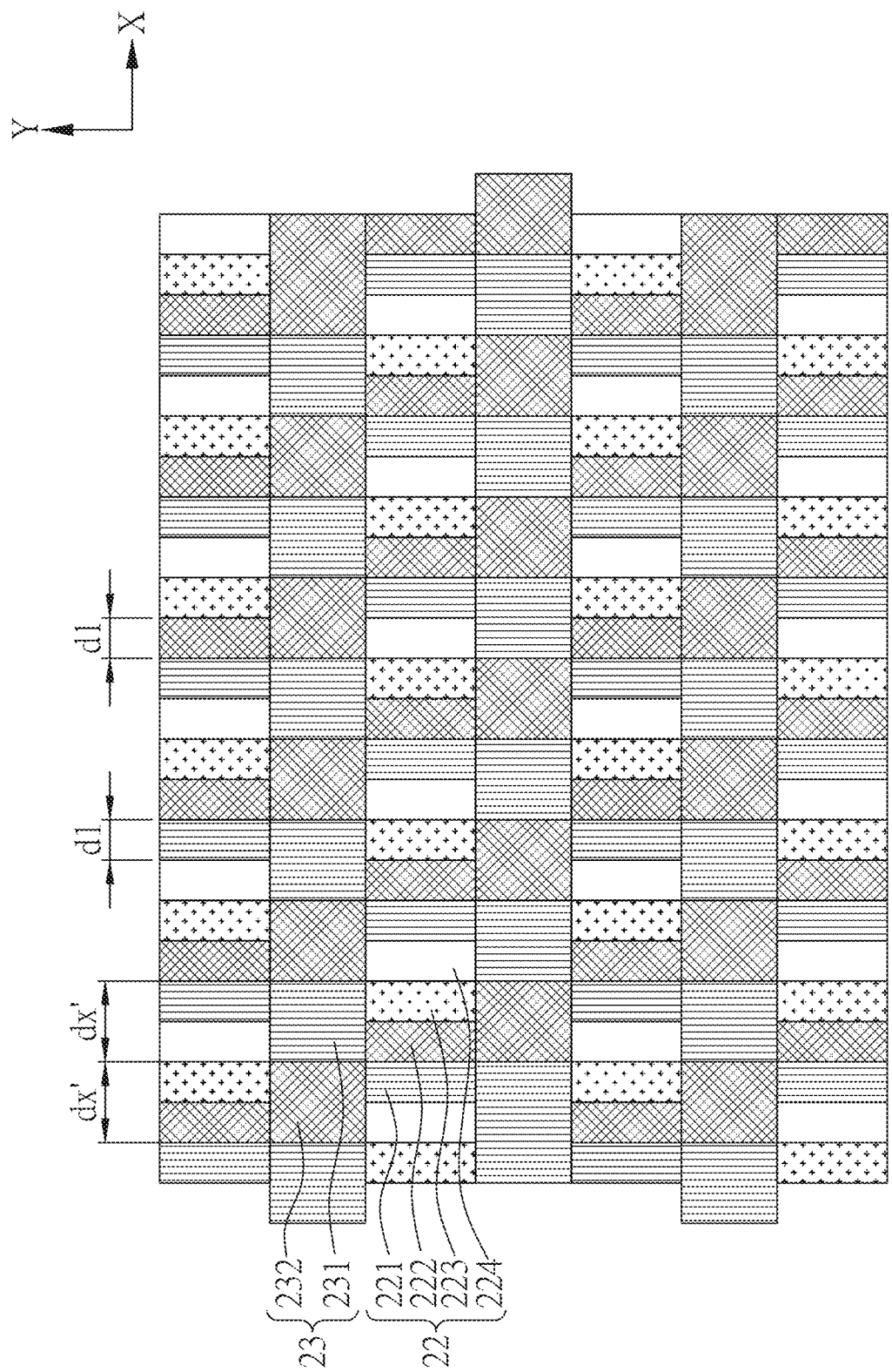
FIG. 14 is a schematic view showing a color resist layer in an electronic device according to another embodiment of the present disclosure.

FIG. 14 is a schematic view showing a color resist layer in an electronic device according to another embodiment of the present disclosure. The electronic device of the present embodiment is similar to that shown in FIG. 7, except for the pattern of the color resist layer. When the first pixel color resist 221 has to have larger adhesion than the third pixel color resist 223 due to the material property of the first pixel color resist 221, even though the area of the first pixel color resist 221 is small, the adhesion of the first pixel color resist 221 can be improved by increasing the color resist area with the first color resist 231 having larger adhesion area, so that the peeling probability of the first pixel color resist 221 can be reduced. Similary, when the second pixel color resist 222 has to have larger adhesion than the third pixel color resist 223 due to the material property of the second pixel color resist 222, even though the area of the second pixel color resist 222 is small, the adhesion of the second pixel color resist 222 can be improved by increasing the color resist area with the second color resist 232 having larger adhesion area, so that the peeling probability of the second pixel color resist 222 can be reduced.

In the present embodiment, the pixel region color resists 22 further comprises a fourth pixel color resist 224. Herein, the fourth pixel color resist 224 is a transparent color resist, but the present disclosure is not limited thereto.

In addition, in the present embodiment, the width dx' of the first color resist 231 at the second direction X is 2 times of the width d1 of the first pixel color resist 221 at the second direction X, and the width dx' of the second color resist 232 at the second direction X is 2 times of the width d1 of the second pixel color resist 222 at the second direction X. In another embodiment, the width dx' of the first color resist 231 at the second direction X is 2 times of the width d2 of the first sub-pixel opening 211 at the second direction X, and the width dx' of the second color resist 232 at the second direction X is 2 times of the width d2 of the second sub-pixel opening 212 at the second direction X.

In other embodiment of the present disclosure, the arrangements of the first pixel color resist 221, the second pixel color resist 222, the third pixel color resist 223 and the fourth pixel color resist 224 are not limited to those shown in the aforesaid embodiments, as long as the color resists in the pixel regions and the shielding regions have the aforesaid features.

In addition, in other embodiment of the present disclosure, the colors of the pixel color resists in the pixel regions and the color resists in the shielding regions are not limited to those described in the aforesaid embodiments, and can be modified according to the requirement for the electronic device. In one embodiment of the present disclosure, the color resists in the shielding region may only comprise green color resists. In another embodiment of the present disclosure, the color resists in the shielding region may comprise red and green color resists. In further another embodiment of the present disclosure, the color resists in the shielding region may comprise red, green and blue color resists. However, the present disclosure is not limited thereto, and the color of the color resists in the shielding region can be modified according to the manufacturing process, color resist material or arrangements of the color resists.

Furthermore, in other embodiments of the present disclosure, the widths of the color resists in the shielding region are not limited to those described in the aforesaid embodiments and can be modified according to the requirement for the electronic device, as long as a width of one color resist in a shielding region is 1.5 times or more of a width of a pixel color resist or a width of a sub-pixel opening corresponding to the pixel color resist in a pixel region (in which the pixel color resist in the pixel region and the color resist in the shielding region are adjacent and have the same color) and less than a width of the second substrate.

Although the present disclosure has been explained in relation to its embodiment, it is to be understood that many other possible modifications and variations can be made without departing from the spirit and scope of the disclosure as hereinafter claimed. The features of the aforesaid embodiments can be combined to each other if no conflict is occurred.

What is claimed is:

1. An electronic device, comprising:
a first substrate;
a second substrate, opposite to the first substrate;
a black matrix layer disposed between the first substrate and the second substrate and comprising a first pixel region and a first shielding region, wherein the first pixel region and the first shielding region are arranged along a first direction, the first pixel region comprises a first sub-pixel opening and a second sub-pixel opening arranged along a second direction, and the first direction is different from the second direction;
a scan line disposed between the first substrate and the second substrate, wherein the scan line extends along the second direction, and the first shielding region overlaps the scan line;
a first color resist and a second color resist disposed in the first shielding region, wherein the first color resist and the second color resist are overlapped in the first shielding region to form an overlapping region, the overlapping region and the black matrix layer are overlapped, and a width of the overlapping region in the second direction is greater than 0 and less than 10% of a width of the first sub-pixel opening in the second direction;
a first pixel color resist disposed corresponding to the first sub-pixel opening in the first pixel region; and
a second pixel color resist disposed corresponding to the second sub-pixel opening in the first pixel region, wherein the first pixel color resist and the second pixel color resist are not overlapped,
wherein in a cross-sectional view, a recess is formed between the first pixel color resist and the second pixel color resist, the recess is disposed in the first pixel region, and the recess comprises a curved side wall.

2. The electronic device as claimed in claim 1, wherein a color of the second color resist is different from a color of the first color resist, and a color of the second pixel color resist is different from a color of the first pixel color resist.

3. The electronic device as claimed in claim 1, wherein the first color resist in the first shielding region has a curved edge.

4. The electronic device as claimed in claim 3, wherein the curved edge of the first color resist overlaps the second color resist.

5. The electronic device as claimed in claim 1, wherein the black matrix layer comprises a top surface and a bottom surface, and a width of the top surface is smaller than a width of the bottom surface.

6. The electronic device as claimed in claim 1, wherein a width of the first pixel color resist in the second direction in the first pixel region is greater than a width of the first sub-pixel opening in the second direction in the first pixel region.

7. The electronic device as claimed in claim 1, wherein the black matrix layer comprises a top surface, the first pixel color resist and the second pixel color resist are not overlapped on the top surface of the black matrix, and part of the top surface of the black matrix is not covered by the first pixel color resist and the second pixel color resist.

8. The electronic device as claimed in claim 1, wherein the black matrix layer comprises a top surface, and the recess is located above the top surface of the black matrix.

* * * * *